United States Patent
Chandra et al.

(10) Patent No.: US 9,726,402 B2
(45) Date of Patent: Aug. 8, 2017

(54) HYBRID MULTILAYER SOLAR SELECTIVE COATING FOR HIGH TEMPERATURE SOLAR THERMAL APPLICATIONS AND A PROCESS FOR THE PREPARATION THEREOF

(71) Applicant: Council of Scientific & Industrial Research, New Delhi (IN)

(72) Inventors: Harish Barshilia Chandra, Karnataka (IN); Jyothi Bharathibai Basu, Karnataka (IN); Lakshmi Ramachandrappa Vara, Karnataka (IN)

(73) Assignee: Council of Scientific & Industrial Research, New Delhi (IN)

( * ) Notice: Subject to any disclaimer, the term of this patent is extended or adjusted under 35 U.S.C. 154(b) by 81 days.

(21) Appl. No.: 14/764,372

(22) PCT Filed: Sep. 11, 2013

(86) PCT No.: PCT/IN2013/000549
§ 371 (c)(1),
(2) Date: Jul. 29, 2015

(87) PCT Pub. No.: WO2014/122667
PCT Pub. Date: Aug. 14, 2014

(65) Prior Publication Data
US 2016/0010896 A1  Jan. 14, 2016

(30) Foreign Application Priority Data
Feb. 8, 2013 (IN) .......................... 0371/DEL/2013

(51) Int. Cl.
*C23C 14/06* (2006.01)
*F24J 2/48* (2006.01)
(Continued)

(52) U.S. Cl.
CPC ........... *F24J 2/485* (2013.01); *C23C 14/0036* (2013.01); *C23C 14/0641* (2013.01); *C23C 14/0676* (2013.01); *C23C 14/081* (2013.01); *C23C 14/083* (2013.01); *C23C 14/35* (2013.01); *C23C 14/352* (2013.01); *C23C 14/584* (2013.01); *C23C 18/122* (2013.01); *C23C 18/1245* (2013.01); *C23C 18/1254* (2013.01);
(Continued)

(58) Field of Classification Search
USPC ................. 204/192, 192.12, 192.15, 192.26; 428/216, 336, 469, 472, 697, 698, 699
See application file for complete search history.

(56) References Cited

U.S. PATENT DOCUMENTS

2004/0233530 A1    11/2004  Kramer et al.
2007/0178316 A1 *   8/2007  Mellott ................... C03C 17/36
                                                              428/426

(Continued)

FOREIGN PATENT DOCUMENTS

EP    1154289 A1    11/2001
EP    2530496 A1    12/2012

OTHER PUBLICATIONS

Budunoglu et al "Fleixble and mechically stable antireflective coatins from nanoporous organically modifed silic colliods" J. Mater. Chem (2012) 22 p. 9671-9677.*
Hao et al., Preparation and thermal stability on non-vacuum high temperature solar selective absorbing coatings, Chinese Science Bulletin (2009), 54(8):1451-1454.
Selvakumar et al., Review of physical vapor deposited (PVD) spectrally selective coatings for mid- and high-temperature solar thermal applications, Solar Energy Materials and Solar Cells (2012), 98:1-23.
Pettit et al., Use of sol-gel thin films in solar energy applications, Solar Energy Materials, (1986), 14(3-5):269-287.
Bostrom et al., Anti-reflection coatings for solution-chemically derived nickel-alumina solar absorbers, Solar Energy Materials and Solar Cells, (2004), 84(1-4):183-191.

*Primary Examiner* — Archene Turner
(74) *Attorney, Agent, or Firm* — Rudy J. Ng; Bret E. Field; Bozicevic, Field & Francis LLP

(57) ABSTRACT

The present invention describes a hybrid multilayer solar selective coating having high thermal stability useful for high temperature solar thermal power generation. The hybrid multilayer solar selective coating of the present invention has been deposited using a novel combination of sputtering and sol-gel methods on metallic and non-metallic substrates, preferably on SS 304 and 321 with chrome interlayer. The hybrid multilayer solar selective coating of the present invention consists of stacks of Ti/chrome interlayer, aluminum titanium nitride (AlTiN), aluminum titanium oxynitride (AlTiON), aluminum titanium oxide (AlTiO) and organically modified silica (ormosil) layers. The chrome interlayer was deposited using an electroplating method, whereas, Ti, AlTiN, AlTiON and AlTiO layers were prepared using a four-cathode reactive unbalanced pulsed direct current magnetron sputtering technique. The ormosil layer was deposited using a sol-gel technique, which provides the enhanced absorptance and improved long term thermal stability in air and vacuum. The present invention provides a hybrid multilayer solar selective coating having absorptance >0.950, emittance <0.11 (SS substrate with chrome interlayer) and long term high thermal stability (in the order of 1000 hrs under cyclic heating conditions at 500° C. in air and 600° C. in vacuum). The hybrid multilayer solar selective coating of the present invention exhibits higher solar selectivity ratio in the order of 5-9 on metal and non-metal substrates. The hybrid multilayer solar selective absorber coating of the present invention has high oxidation resistance, stable microstructure, high adherence and graded composition particularly suitable for applications in concentrating collectors like evacuated receiver tubes and Fresnel receiver tubes useful for solar steam generation.

13 Claims, No Drawings

(51) Int. Cl.
  *C23C 14/00* (2006.01)
  *C23C 14/08* (2006.01)
  *C23C 14/35* (2006.01)
  *C23C 18/12* (2006.01)
  *C25D 7/00* (2006.01)
  *C23C 28/00* (2006.01)
  *F24J 2/46* (2006.01)
  *C23C 14/58* (2006.01)
  *C25D 5/48* (2006.01)
  *C23C 14/02* (2006.01)
  *C23C 14/50* (2006.01)

(52) U.S. Cl.
  CPC ............ *C23C 28/00* (2013.01); *C23C 28/321* (2013.01); *C23C 28/34* (2013.01); *C23C 28/345* (2013.01); *C23C 28/3455* (2013.01); *C25D 5/48* (2013.01); *C25D 7/00* (2013.01); *F24J 2/4652* (2013.01); *F24J 2/48* (2013.01); *C23C 14/025* (2013.01); *C23C 14/505* (2013.01); *Y02E 10/40* (2013.01)

(56) References Cited

U.S. PATENT DOCUMENTS

2009/0004462 A1* 1/2009 Zhang ................... C08L 83/06
  428/331
2010/0313875 A1* 12/2010 Kennedy .................. F24J 2/055
  204/192.28

* cited by examiner

HYBRID MULTILAYER SOLAR SELECTIVE COATING FOR HIGH TEMPERATURE SOLAR THERMAL APPLICATIONS AND A PROCESS FOR THE PREPARATION THEREOF

FIELD OF THE INVENTION

The present invention relates to a hybrid multilayer solar selective coating for high temperature solar thermal applications. The present invention particularly relates to a hybrid multilayer solar selective coating having enhanced absorptance ($\alpha$>0.950), reduced emittance ($\epsilon$<0.11) and high thermal stability in air (up to 500° C.) and vacuum (up to 600° C.) suitable for solar thermal power generation. More importantly, it relates to a hybrid multilayer coating consisting of stacks of Ti/chrome interlayer, aluminum titanium nitride (AlTiN), aluminum titanium oxynitride (AlTiON), aluminum titanium oxide (AlTiO) and organically modified sol-gel silica (ormosil) layers coated on metallic and non-metallic substrates preferably on stainless steel (SS) 304 and 321 substrates. The chrome interlayer was deposited using an electroplating method, whereas, Ti, AlTiN, AlTiON and AlTiO layers were prepared using a four-cathode reactive unbalanced pulsed direct current magnetron sputtering technique. The ormosil layer was deposited using a sol-gel technique, which provides the enhanced absorptance and improved thermal stability in air and vacuum.

BACKGROUND OF INVENTION AND DESCRIPTION OF PRIOR-ART

In order to make the solar thermal energy more affordable, in addition to improvement in the solar thermal power plant design and associated support structure for solar fields, solar absorber coatings with improved optical properties and thermal stability need to be developed. An ideal high-temperature solar selective coating must have high absorptance (>0.940), low thermal emittance (≤0.10 at 400° C.), stability up to 500° C. in air with improved durability and manufacturability and reduced cost [reference may be made to C. E. Kennedy, Proceedings of International Solar Energy Conference, Aug. 6-12, 2005, Orlando, USA]. A variety of physical vapor deposition processes—PVD—(such as evaporation, ion plating, cathodic arc evaporation, pulsed laser deposition and sputtering) have been used to develop high-temperature solar selective coatings. Pt—$Al_2O_3$, Ni—$Al_2O_3$, Ni—$SiO_2$, Cr—SiO, Mo—$Al_2O_3$, Mo—$SiO_2$, W—$Al_2O_3$ coatings have been used for the high temperature solar selective applications. Although these coatings have good thermal stability in vacuum and low thermal stability (≤300° C.) in air, suitable coating modifications have been done to improve the thermal stability of these coatings up to some extent.

One of the most essential requirements of solar selective absorbers is their stable structural composition when they operate at high temperatures. Optical properties of these coatings should not degrade with rise in temperature or over a period of use.

The hybrid multilayer solar selective coating of the present invention is deposited on metallic and non-metallic substrates preferably on stainless substrates (SS 304 and 321) with and without chrome plating using sputtering process in combination with sol-gel method, which are environmental friendly. The main utility of the present invention is for high temperature applications, particularly, in solar steam generators and steam turbines for producing electricity.

Earlier, the applicant had developed a high temperature thermally stable solar selective coating for effectively harnessing the solar energy. Patent application is filed in India (Application No. 3655DEL2011). In this patent, a multilayer solar selective coating containing tandem stacks of Ti/chrome interlayer, aluminum titanium nitride, aluminum titanium oxynitride, aluminum titanium oxide was coated on metallic and non-metallic substrates using a sputtering method. This coating exhibits absorptance of 0.930 and emittance of 0.160.17 on stainless steel substrates and displays thermal stability in air up to 350° C. and in vacuum up to 450° C. for longer durations under cyclic heating conditions. The coating also displays improved adhesion, UV stability, corrosion resistance and stability under extreme environments. But this invention has two limitations: (i) the absorptance is 0.930 and thermal stability is low (350° C. in air 450° C. in vacuum). These limitations of the earlier invention directed the inventors to evolve a hybrid multilayer solar selective coating using a novel combination of sputtering and sol-gel methods for depositing a hybrid multilayer solar selective coating suitable for high temperature applications for effectively harnessing solar energy.

In the present invention, an organically modified silica (ormosil) layer is deposited over the multilayer coating containing tandem stacks of Ti/chrome interlayer, aluminum titanium nitride (AlTiN), aluminum titanium oxynitride (AlTiON), aluminum titanium oxide (AlTiO) on metallic and non-metallic substrates more preferably on stainless steel 304 and 321 substrates. The chrome interlayer was prepared using a standard electroplating process, whereas, Ti, AlTiN, AlTiON and AlTiO layers were prepared using a four-cathode reactive unbalanced pulsed direct current magnetron sputtering technique. The ormosil layer, deposited using a sol-gel/dip coating technique, provides the enhanced absorptance and improved high thermal stability in air and vacuum for the hybrid multilayer solar selective coating of the present invention.

The present invention provides a hybrid multilayer solar selective coating having absorptance >0.950, emittance <0.11 (on chrome plated SS substrate) and high thermal stability (long life in the order of 1000 hrs under cyclic heating conditions in air at 500° C.). It also provides a hybrid multilayer solar selective coating having higher thermal stability in vacuum at 600° C. up to 1000 hrs under cyclic heating conditions. Hybrid multilayer solar selective coating of the present invention exhibits higher solar selectivity ratio in the order of 5-9 on metal and non-metal substrates. The hybrid multilayer solar selective absorber coating of the present invention has high oxidation resistance, stable microstructure, high adherence and graded composition particularly useful for high temperature solar thermal power generations.

Prior-art search was made in public domain for patent as well as non-patent literature to find out the related work carried out, in areas of the present invention. Some of the recent works, which are related to the field of the present invention, are discussed below.

In order to improve the overall solar selectivity of the absorber coatings, it is necessary to combine two or more deposition techniques. For example, a suitable protective coating with anti-reflective property prepared by sol-gel method can be applied on standard PVD absorber coatings. As will be discussed in the prior-art, such attempts have been made in the past for electrodeposited black chrome coating.

For example, sol-gel protective coatings have been used for black chrome solar selective films [reference may be made to R. B. Pettit and C. J. Bruker, SPIE Optical Coatings for Energy Efficiency and Solar Applications 324 (1982) 176]. The sol-gel coating process consists of applying an alcoholic solution containing polymeric glass precursors. After the coating is fixed for one-half hour at 450° C., a glass layer was obtained. For the best combination of process variables, the solar absorptance of the sol-gel coated sample decreased from 0.97 to 0.95 after 100 hrs at 400° C., while for an uncoated black chrome coating, the absorptance decreased to 0.89. At 400° C., the sol-gel protected the black chrome coating.

The use of sol-gel thin films in solar energy applications has been reviewed by Pettit and Brinker [Solar Energy Materials 14 (1986) 269]. Sol-gel thin films for solar energy applications have been used in: (i) encapsulation of black chrome solar selective coatings, for improved thermal stability (ii) formation of porous, antireflection coating on glass envelopes used in solar thermal collectors for increased transmittance, (iii) double-layer, antireflection coatings of $SiO_2$ and $TiO_2$ on silicon solar cells to improve cell efficiency and (iv) protective coatings applied to silvered stainless steel solar mirrors.

References may be made to U.S. Pat. No. 6,783,653 B2 wherein a sol-gel layer protects the structured metallic overlayer of the solar selective absorption coatings. The selective absorber layer contains pinnacles which are tall and thin and have dimensions and inter-pinnacle spacing such that the absorptivity of the coating is very high in the solar spectrum while the emissivity in the infrared region is very low. The absorber layer is protected both physically and chemically by a sol-gel layer, which is comprised of a network of highly polymerized monomers. The monomers are typically oxides of network forming elements (e.g., Al, B, Mg, Ti, Si, Zn, etc.). It is claimed that the sol-gel layer provides mechanical stability and environmental protection to about 350° C. and also enhances the solar absorption of the coating. This invention uses copper as the substrate, which cannot be used for high temperature applications. Further the Sol gel layer provides mechanical stability and environmental protection only up to 350° C.

Reference may be made to Harizanov et al., Ceramics International 22 (1996) 91, wherein the sol-gel and chemical vapor deposition (CVD) methods have been used independently to prepare oxide coatings for solar energy utilization. The sol-gel coating consisted of $TiO_2/0.25$ MnO, while the CVD coating consisted of $WO_3$. It has been shown that the sol-gel coating offers promising performance in passive solar control glazing due to the relatively high refractive index. This paper doesn't disclose the information on the absorptance, emittance and solar selectivity of the sol gel and CVD metal oxide coatings, which decides the application of coatings for solar thermal power generation.

References may be made to US patent No. US 2011/0003142 A1, wherein nanoparticle composite hybrid transparent coating has been prepared by sol-gel process. The composite hybrid thick transparent hard coating is the gelled dispersion of nanoparticles in a sol with at least one hydrolysable silane and at least one hydrolysable metal oxide precursor. The invention reports deposition of 5 μm thick hybrid coating even on plastic substrates. This invention discloses only mechanical properties of 5 μm thick hybrid transparent sol-gel coating and there is no mention of optical properties of coating.

References may be made to Katumba et al., Solar Energy Materials and Solar Cells 92 (2008) 1285, wherein carbon nanoparticles embedded in ZnO and NiO selective solar absorbers have been prepared using sol-gel technique. ZnO based absorber coatings exhibited thermal emittance, of 6% and absorptance of 71%, whereas NiO based samples exhibited thermal emittance of 4% and absorptance of 84%. The substrate used in this work is suitable for low temperature application and not for high temperature application those are needed in case of solar thermal power generation.

References may also be made to Vince et al., Solar Energy Materials and Solar Cells 79 (2003) 313, wherein CoCuMnO$_x$ absorber coatings have been prepared by sol-gel process. These coatings exhibited absorptance of 0.85-0.91 and emittance of 0.036 on Al substrates. The researchers have tested the coating deposited on Aluminum in the boiling water (~100° C.) and no high temperature test have been reported in the paper. It should be noted that Aluminum is suitable for low temperature application.

References may also be made to Lira-Cantx et al., Solar Energy Materials and Solar Cells 87 (2005) 685, wherein the use of silica based sol-gel anti-reflection coating on black nickel solar absorber coating has been reported. The silica coating improved the absorptance when drying at 200° C., however, the absorptance decreased while heating the coating system at 300° C. due to degradation of the black nickel surface. The thickness of the silica coating was approximately 400 nm. The absorber coating developed by the researchers was prepared by the electro-chemical route and thus it is not suitable for high temperature application.

References may be made to Nostell et al., Thin Solid Films 351 (1999) 170, wherein silica based anti-reflective films on glass have been prepared by a dip-coating method from a sol-gel process. The total solar transmittance of silica anti-reflective coating increased by 5.4%. The coatings also exhibited improved scratch resistance and the adhesion between the film and the substrate after baking the silica film at higher temperatures. Similar improvement in the transmittance of a transparent cover by depositing anti-reflective transparent sol-gel coating has been reported by Gombert et al. [Solar Energy 68 (2000) 357]. The coatings presented in these works have been developed on glass substrate for improving the anti reflection properties. The papers doesn't provide any information on absorptance and emittance of the coating.

In order to simplify the solar energy system design and lower the cost of solar thermal power plant, there is a universal requirement for the development of solar selective coatings, which can operate at very high temperatures in air. A considerable technology development needs to be carried out in this direction, because prolonged heating of solar absorber coatings in air at higher temperatures can not only oxidize the coating, but also can induce other microstructural changes which degrade the overall solar selectivity of the spectrally selective coatings. Manufacturing a hybrid coating using two or more methods can play a significant role in evolving such a coating. The sputtering method provides the basic solar absorber coating with an absorptance of 0.930 and emittance of 0.16-0.17 on SS substrates. The ormosil layer deposited by sol-gel dip coating provides enhanced absorptance (>0.950) and improved thermal stability (~500° C. in air). Therefore, hybrid coatings consisting of PVD and other processes (e.g., sol-gel) need to be developed in order to reduce the cost of solar absorber coating technology. Prior-art referred as above shows the only combination of sol-gel with black chrome coating and CVD. But these methods provide a coating for mid-temperature applications and these coatings are reported to have thermal stability only up to 400° C. for shorter durations.

Also inorganic sol-gel coatings are susceptible to cracking, thus limiting their applications for improving the thermal stability of the solar absorber coatings for high temperature applications. None of the prior-art shows the combination of sputtering and sol-gel coating for designing a high temperature solar selective coating with thermal stability up to 500° C. in air. In the present invention, two deposition routes (sputtering and sol-gel) have been used for designing the improved high temperature solar selective coating. Interlayer is deposited on substrate before depositing absorber layers for reducing the emittance and the barrier layer is deposited for improving the thermal stability.

OBJECTS OF THE INVENTION

The main objective of the present invention is to provide a hybrid multilayer solar selective coating on metal and non-metal substrates more preferably on stainless steel substrates with improved absorptance (0.950), reduced emittance (<0.11) and long term thermal stability in air (up to 500° C.) and vacuum (up to 600° C.) under cyclic heating conditions.

Another objective of the present invention is to provide a hybrid multilayer solar selective coating consists of stacks of Ti/chrome interlayer, aluminum titanium nitride (AlTiN), aluminum titanium oxynitride (AlTiON), aluminum titanium oxide (AlTiO) and organically modified silica (ormosil) coated on metal and non-metal substrates preferably on stainless steel 304 and 321 substrates. The Ti, AlTiN, AlTiON and AMC) layers were prepared using a four-cathode reactive unbalanced pulsed direct current magnetron sputtering technique and the ormosil layer was deposited using a sol-gel dip coating technique.

Yet another objective of the present invention is to provide a hybrid multilayer solar selective coating suitable for high temperature solar thermal applications.

Yet another objective of the present invention is to provide a hybrid multilayer solar selective coating having high solar selectivity ratio in the order of 5 to 9 on metal and non-metal substrates.

Still another objective of the present invention is to provide a hybrid multilayer solar selective coating having very high thermal resistance (up to 500° C. in air and 600° C. in vacuum under cyclic heating conditions) suitable for applications in concentrating collectors like evacuated receiver tubes and Fresnel receiver tubes useful for solar steam generation.

Still another objective of the present invention is to provide a hybrid multilayer solar selective coating having very high absorptance (>0.950) and low emittance (0.10-0.11) on metal and non-metal substrates.

SUMMARY OF THE INVENTION

Accordingly, present invention provides a hybrid multilayer solar selective coating comprising a tandem stack of layers containing interlayer of chromium/titanium, first absorber layer of aluminum-titanium nitride (AlTiN), second absorber layer of aluminum-titanium oxynitride (AlTiON), an antireflection layer of aluminum-titanium oxide (AlTiO) and a barrier layer of organically modified silica (ormosil), wherein the said coating exhibiting thermal resistance up to 500° C. in air and up to 600° C. in vacuum with a solar selectivity ratio in the order of 5 to 9.

In an embodiment of the present invention, said coating is stable under UV irradiation, external environment and thermal shock.

In one embodiment of the present invention, thicknesses of Ti interlayer, first absorber layer, second absorber layer, antireflection layer and barrier layer are in the range of 10-80 nm, 30-70 nm, 20-40 nm, 30-55 nm and 50-200 nm respectively.

In another embodiment of the present invention, thickness of chrome interlayer is in the range of 3-7 μm.

In yet another embodiment of the present invention, the composition of the first absorber layer is: Al=25-55 at. %, Ti=10-25 at. % and N=30-50 at. %, second absorber layer is: Al=15-30 at. %, Ti=10-15 at. %, N=10-20 at. %, antireflection layer is Al=15-30 at. %, Ti=5-15 at. % and O=40-80 at. % organically modified sol-gel silica layer (ormosil) is Si=16-30 at. %, C=3-15 at. %, O=25-59 at. % and H=8-44 at. %.

In yet another embodiment of the present invention, said coating is useful for solar thermal power generation.

In yet another embodiment, present invention provides a process for the preparation of a hybrid multilayer solar selective coating comprising the steps of:
a. metallographically polishing and chemically cleaning of substrate in an ultrasonic agitator in acetone, absolute alcohol and trichloroethylene;
b. depositing a interlayer either by sputtering or electroplating;
c. depositing solar absorber layers consisting of aluminum titanium nitride (AlTiN), aluminum titanium oxynitride (AlTiON) and aluminum titanium oxide (AlTiO) using four-cathode reactive pulsed direct current unbalanced magnetron sputtering system;
d. depositing ormosil layer by dip-coating to obtain hybrid multilayer solar selective coating.

In yet another embodiment of the present invention, said substrate is selected from metallic and non-metallic group preferably stainless steel having chrome interlayer particularly for reducing the emittance.

In yet another embodiment of the present invention, said ormosil layer is prepared by sot gel method using a sol prepared by two precursor silanes consisting of (a) a silane of formula $SiR'_4$, wherein R' is a hydrolysable alkoxy group and (b) silane of the formula $SiR'_n R''_{(4-n)}$, where R' is a hydrolysable alkoxy group and R'' is non-hydrolysable group comprising of any one of the groups such as alkyl, vinyl, alkenyl or aryl group, or alkyl group with a functional group such as epoxy, amino, isocyanate or acrylate group containing at least one such non-hydrolysable group.

DETAILED DESCRIPTION OF THE INVENTION

The present invention provides a hybrid multilayer solar selective coating with improved absorptance and long term thermal stability in air and vacuum. The hybrid multilayer solar selective coating consists of stacks of Ti/chrome interlayer, aluminum titanium nitride (AlTiN), aluminum titanium oxynitride (AlTiON), aluminum titanium oxide (AlTiO) and organically modified silica (ormosil) coated on metallic and non-metallic substrates preferably on stainless steel 304 and 321 substrates. The Ti, AlTiN, AlTiON and AlTiO layers were prepared using a four-cathode reactive unbalanced pulsed direct current magnetron sputtering technique, whereas, the organically modified silica (ormosil) layer was deposited by dip coating using sol-gel process and acts as a diffusion barrier layer. The ormosil coating combines organic and inorganic domains in a nanometric scale. Inorganic sol-gel silica coating often contains micro-scale pores, cracks, and areas of low cross-linking density and these provide pathways for diffusion of gases, ions and other corrosive species to the coating/substrate interface. In the ormosil coating, an organic moiety is introduced into the inorganic network so that the hybrid coating blends the mechanical and chemical characteristics of the organic and the inorganic networks resulting in a dense barrier film. The presence of the organic part makes the sol-gel network more flexible and less prone to cracking. The inorganic part renders high hardness and scratch resistance to the film.

The hybrid multilayer solar selective coating of the present invention was mainly deposited on metal and non-metal substrates and exhibited an average emittance of 0.16-0.17 on SS substrates. The high emittance for these samples is attributed to the intrinsic property of the SS substrate ($\epsilon=0.10$-0.11). The SS substrate is chosen for the present invention mainly due to the fact that for steam generation, the substrate may reach a temperature greater than 450° C. and at these temperatures copper and other commonly used, substrates start diffusing out to the absorber coating, thus affecting its optical properties. Additionally, copper and other metal substrates get corroded very easily with supersaturated steam and non-metallic substrates such as glass are difficult to handle practically at high temperature and pressure. In order to reduce the emittance of the absorber coating of the present invention the SS substrates were pre-treated with a 5 μm thick chrome plating using standard electroplating process. The emittance of the chrome plated SS was in the range of 0.05-0.07. Stainless steel 304 and 321 substrates with and without chrome plating were used for the present invention. Before putting the substrates into the vacuum chamber, they were metallographically polished or buffed to remove the surface oxides and to make the surface homogeneous. The polished/buffed substrates were then chemically cleaned using an ultrasonic agitator to remove the grease and other impurities such as dust and debris. The electroplating on SS substrates was performed after metallographical polishing and subsequent cleaning. Chemically cleaned substrates were positioned in the sputtering system. The vacuum chamber was pumped down to a base pressure in the order of $3.0$-$6.0\times10^{-4}$ Pa to remove any gaseous impurities. The substrates were degassed in vacuum using a substrate heater. In order to remove native oxides on the substrate surface further cleaning was carried out using argon ion bombardment (bias voltage: −500 to -1200 V). After cleaning the substrates a Ti interlayer of 10-80 nm was deposited on the substrates for improving the adhesion. The first absorber layer was deposited by sputtering of two Ti and two Al targets in the argon-nitrogen plasma at a pressure in the range of 0.1-0.5 Pa. The content of Al was higher than Ti in the first absorber layer. The second absorber layer was deposited by sputtering of two Ti and two Al targets in the argon-nitrogen-oxygen plasma at a pressure in the order of 0.1-0.5 Pa. The content of Al was higher than Ti in the second absorber layer. Subsequently, an anti-reflection layer was deposited by sputtering of two Ti and two Al targets in the argon-oxygen plasma at a pressure of the order of 0.1-0.5 Pa. Again, the content of Al was higher than Ti in the anti-reflection layer. Finally, the anti-reflection layer was etched in $Ar+O_2$ plasma at a substrate temperature in the range of 100-350° C. for a duration of 20-60 min to stabilize the microstructure of the AlTiO layer. The tandem stack of three layers effectively increased the absorptance and reduced the emittance of the solar selective coating.

The sol for the ormosil layer was prepared by the hydrolysis and condensation of a mixture of two precursor silanes consisting of (a) a silane of formula $SiR'_4$, wherein R' is a hydrolysable alkoxy group and (b) another silane of the formula $SiR'_nR''_{(4-n)}$, where R' is a hydrolysable group and R" is non-hydrolysable group comprising of any one of the groups such as alkyl, vinyl, alkenyl or aryl group, or alkyl group with a functional group such as epoxy, amino, isocyanate or acrylate group with the condition that there should be at least one such non-hydrolysable group. The molar ratio of first silane (a) to second silane (b) was in the range of 1:10 to 10:1. A solvent of the formula, ROH, wherein R is an alkyl group is used for homogenisation of silane, acid and water and also for dilution of the sol. An acid catalyst, wherein the acid is an inorganic acid like hydrochloric, hydrofluoric, sulphuric, nitric, or phosphoric acid, or an organic acid like acetic, or oxalic acid, is used wherein the acid concentration was in the range of 0.01 M to 1.0 M. The molar ratio of total silane to solvent was in the range of 1:1 to 1:10. The amount of water needed for hydrolysis and condensation of the sol is controlled so that the water to total silane molar ratio is in the range of 2 to 10. The temperature of the hydrolysis of the sol was in the range of 20-50° C. and the stirring time was in the range of 6 to 72 hrs. The viscosity of the final sol was in the range of 2-5 cP. The sol was clear and transparent and was stored in an air-tight container for a period of 1 to 3 months.

The sputtered solar absorber coated substrate was cleaned in acetone and dried in air followed by clearing in ethanol. The ormosil layer was deposited on the cleaned solar absorber coating by dipping in the sol. The dipping parameters were: dipping speed, 20-200 mm/min, waiting time in the sol, 1 to 10 min, lifting speed, 20-200 mm/min and drying time, 1 to 10 min. The ormosil coating was cured by keeping it at room temperature for 2 to 24 hrs followed by heat treatment at 100 to 200° C. for a time in the range of 5 to 10 hrs. The thickness of the ormosil coating was in the range of 50-300 nm. The transmittance of the ormosil coating was 99% with reference to the glass substrate.

The novelty of the present invention lies in providing a hybrid multilayer solar selective coating having absorptance >0.950, emittance <0.11 and long term high thermal stability (in the order of 1000 hrs under cyclic heating conditions in air at 500° C.). It also provides a multilayer solar selective coating having higher thermal stability in vacuum at 600° C. up to 1000 hrs under cyclic heating conditions. Solar selective coating of the present invention exhibits higher solar selectivity ratio in the order of 5-9 on metal and non-metal substrates. The coating of the present invention is thermally stable in air and vacuum at higher temperatures. The long term thermal stability is provided by the ormosil barrier layer wherein the sol process parameters such as sol composition, viscosity of the sol, coating application parameters, curing steps, etc. are optimized to achieve a dense crosslinking network without any defects like micro-pores and cracks. The hybrid solar selective absorber coating of the present invention has high oxidation resistance, stable microstructure, highly adherent and graded composition particularly useful for high temperature solar thermal power generation.

The above mentioned novelty of the present invention has been achieved by adopting the following non-obvious inventive steps:
1. A novel combination of sputtering and sol-gel methods for depositing hybrid multilayer solar selective coating
2. Incorporation of organic and inorganic components in the ormosil coating using sol-gel method to provide transparent crack-proof barrier coating
3. Deposition of interlayer for reducing the emittance of the coated substrates and enhancing the solar selectivity ratio in the order of 5 to 9

EXAMPLES

The following examples are given by way of illustration and therefore should not be construed to limit the scope of the present invention.

Example 1

Deposition of Solar Absorber Coating by Sputtering on Stainless Steel And Copper Substrates Before putting the substrates into the vacuum chamber, the stainless steel and copper substrates (having dimensions 35 mm×35 mm×2 mm) were metallographically polished and chemically cleaned in an ultrasonic agitator in acetone, absolute alcohol and trichloroethylene. The SS substrates were electroplated with chromium after polishing. The vacuum chamber was pumped down to a base pressure of $1.0 \times 10^{-4}$ Pa using a turbo-molecular pump backed by a rotary pump. The substrates were cleaned in situ by argon ion bombardment for 60 min, wherein a DC bias of −500 V was applied to the substrate at an argon pressure of $8.0 \times 10^{-1}$ Pa. The solar absorber film was deposited on the substrates using four-cathode reactive pulsed direct current unbalanced magnetron sputtering system. Two Ti and two Al targets were used for the sputtering of AlTiN, AlTiON and AlTiO layers. The power densities for Ti and Al targets were 2.75 and 3.0 watts/cm$^2$, respectively. The substrates were heated at a temperature of 300° C. For the AlTiN layer the nitrogen flow rate was 15 standard cubic centimeter per minute (sccm). The argon flow rate was 25 sccm. For the AlTiON layer the nitrogen flow rate was 10 sccm and the oxygen flow rate was 20 sccm. Whereas, the oxygen flow rate for the AlTiO layer was 30 sccm. The said anti-reflection layer was etched in Ar+O$_2$ plasma with an oxygen flow rate of 40 sccm and a substrate temperature of 300° C. A planetary rotation system was employed for achieving uniform absorber coating. After deposition of layers, the coated SS substrate has 5 μm thick chromium interlayer (the copper substrate has 50 nm thick Ti layer), 50 nm thick first absorber layer, 60 nm thick second absorber layer and 30 nm thick antireflection layer, respectively. Similarly, stainless steel substrates were also sputtered deposited without chrome interlayer and their detailed characterization has been given in following tables.

Example 2

Preparation of the Sol and Deposition of Ormosil Layer on Sputter Deposited Substrates of Example 1

The sol for the ormosil layer was prepared by the hydrolysis and condensation of a mixture of two precursor silanes consisting of tetraethoxysilane [Si (OC$_2$H$_5$)$_4$] and methyl triethoxysilane [CH$_3$—Si—(OC$_2$H$_5$)$_3$]. The molar ratio of tetraethoxysilane and methyl triethoxysilane was 1:1. 6.6 ml of tetraethoxysilane and 6 ml methyl triethoxysilane were added in drops to 7 ml ethanol while stirring magnetically. 2.16 ml 0.015 molar HCl also was added to the mixture in drops. The mixture was stirred magnetically at 30° C. for 24 Hrs. The sot was diluted to 60 ml with ethanol. The molar ratio of total silane to solvent was 1:1. The molar ratio of water to total silane was 3:1. The temperature of the hydrolysis of the sol was 30° C. and the stirring time was 24 hrs. The viscosity of the final sol was 2 cP.

The substrate surface coated with solar absorber coating as described in Example 1 was cleaned in 10 ml acetone and dried in air followed by ultrasonication in ethanol and rinsing in ethanol prior to applying the ormosil coating by dip coating. The dipping parameters were: dipping speed, 80 mm/min, waiting time in the sol, 2 min, lifting speed, 80 mm/min and drying time, 5 min. The ormosil coating was cured by keeping it at room temperature for 6 hrs followed by heat treatment at 100° C. for 6 hrs. The thickness of the ormosil coating was 110 nm.

The optical properties (absorptance and emittance) of the samples were measured using standard instruments procured from M/s. Devices and Services, USA. Emittance was measured at 82° C. The accuracies for the measurements of the emittance and the absorptance were ±0.01 and ±0.002, respectively. The absorptance and the emittance values of SS/Ti/AlTiN/AlTiON/AlTiO/ormosil, SS/chrome/AlTiN/AlTiON/AlTiO/ormosil and Cu/Ti/AlTiN/AlTiON/AlTiO/ormosil are given in Table 1. The absorber coating on the SS substrate with titanium interlayer exhibited absorptance of 0.950 and emittance of 0.17 whereas, for chrome plated samples the absorptance was 0.953 and the emittance was 0.12. On copper substrate the absorptance was 0.956 and the emittance was 0.09. Even though, hybrid multilayer solar selective coated copper substrate shows the lower emittance as compared to chrome plated stainless steel substrates, it cannot be used for high temperature applications because of outward diffusion of copper on absorber coating.

TABLE 1

Absorptance and emittance values of hybrid multilayer solar selective coating of the present invention deposited on SS substrates with and without chrome plating and on Cu substrate.

| Material | α | α |
|---|---|---|
| SS/Ti/AlTiN/AlTiON/AlTiO/ormosil | 0.950 | 0.17 |
| SS/chrome/AlTiN/AlTiON/AlTiO/ormosil | 0.953 | 0.12 |
| Cu/Ti/AlTiN/AlTiON/AlTiO/ormosil | 0.956 | 0.09 |

Example 3

Effect of Heat-Treatment in Air

The hybrid multilayer solar selective coating of the present invention deposited on SS substrates, as described in Examples 1 and 2, was heated in air in a resistive furnace at a temperature of 500° C. for testing the thermal stability. Annealing involved increasing the temperature of the sample from 25° C. to the set temperature at a slow heating rate of 3° C/min and maintaining at 500° C. for 6 hrs. Subsequently, the samples were cooled down at a rate of 3° C/min. The accuracy of the temperature controller was ±1° C. at 500° C. . The annealing experiments were repeated at 550° C., 600° C., 650° C. and 700° C. under the identical conditions as mentioned above to observe the rate of degradation of absorber coating. The effect of heat-treatment on absorptance and the emittance values of the SS/Ti/AlTiN/AlTiON/AlTiO/ormosil solar selective coating of the present invention deposited on SS substrates are shown in Table 2. The heat-treatment studies indicated that the absorber coating was stable up to 600° C. and the absorptance decreased gradually at temperature greater than 650° C.

TABLE 2

Effect of annealing at different temperatures (in air) on optical properties of the SS/Ti/AlTiN/AlTiON/AlTiO/ormosil solar selective coating of the present invention deposited on SS substrates.

| Temperature (° C.) | Duration (hrs) | α | ε |
|---|---|---|---|
| As-deposited | — | 0.957 | 0.17 |
| 500 | 6 | 0.956 | 0.17 |
| 550 | 6 | 0.956 | 0.17 |
| 600 | 6 | 0.956 | 0.17 |
| 650 | 6 | 0.912 | 0.17 |
| 700 | 6 | 0.897 | 0.17 |

In order to test the long term thermal stability of the absorber coating of the present invention the heat treatment studies were carried out at 500° C. in air under cyclic heating conditions (1000 hrs) on 2 set of samples prepared with and without chrome plating. The absorptance and emittance values were measured at different intervals and are summarized in Tables 3 and 4. No changes in the values of absorptance and emittance were observed as a result of prolonged heating for more than 1000 hrs for both the coatings. This demonstrates that the hybrid multilayer coating of the present invention can be used for applications in air wherein the temperature is up to 500° C.

TABLE 3

Effect of annealing at 500° C. (in air) on optical properties of the SS/Ti/AlTiN/AlTiON/AlTiO/ormosil solar selective coating of the present invention deposited on SS substrate under cyclic heating conditions.

| Total time of exposure (hrs) | α | ε |
|---|---|---|
| 0 | 0.953 | 0.17-0.18 |
| 102 | 0.966 | 0.15 |
| 205 | 0.968 | 0.16 |
| 268 | 0.967 | 0.17 |
| 362 | 0.967 | 0.18 |
| 457 | 0.963 | 0.17 |
| 649 | 0.965 | 0.17 |
| 769 | 0.964 | 0.17 |
| 1033 | 0.964 | 0.18 |

TABLE 4

Effect of annealing at 500° C. (in air) on optical properties of the SS/Chrome/AlTiN/AlTiON/AlTiO/ormosil solar selective coating of the present invention deposited on SS substrate under cyclic heating conditions.

| Total time of exposure (hrs) | α | ε |
|---|---|---|
| 0 | 0.953 | 0.11-0.12 |
| 249 | 0.958 | 0.11 |
| 298 | 0.956 | 0.11 |
| 447 | 0.950 | 0.10 |
| 598 | 0.945 | 0.12 |
| 956 | 0.935 | 0.12-0.13 |
| 1033 | 0.935 | 0.12 |

The heat treatment was also carried out at 550° C. for longer durations under cyclic heating conditions. The absorptance and emittance values were measured at different intervals and are summarized in Table 5. As seen from Table 5 the absorber coating of the present invention is stable in air at 550° C. only up to 115 hrs. The absorptance of the coating decreased after heating at 550° C. for longer durations.

TABLE 5

Effect of annealing at 550° C. (in air) on optical properties of the SS/Ti/AlTiN/AlTiON/AlTiO/ormosil solar selective coating of the present invention deposited on SS substrate under cyclic heating conditions.

| Total time of exposure (hrs) | α | ε |
|---|---|---|
| 0 | 0.955 | 0.18 |
| 40 | 0.958 | 0.18 |
| 74 | 0.959 | 0.19 |
| 115 | 0.956 | 0.19 |
| 193 | 0.947 | 0.20 |
| 236 | 0.933 | 0.19 |
| 282 | 0.865 | 0.18 |
| 362 | 0.761 | 0.17 |

Example 4

Effect of Heat-Treatment in Vacuum

The hybrid multilayer solar selective coating of the present invention, deposited on SS substrates (without chrome plating) following the procedure given in Examples 1 and 2, was also subjected to heat-treatment in vacuum (2.0-8.0×10$^{-4}$ Pa) for different temperatures and durations at cyclic heating conditions. Annealing involved increasing the temperature of the sample from 25° C. to 450° C. at a slow heating rate of 5° C/min and maintaining the temperature at 450° C. for 6 hrs. Subsequently, the samples were cooled down at a rate of 5° C/min. The accuracy of the temperature controller was ±1° C. at the temperature 450° C. The annealing experiments were repeated at 500° C., 550° C., 600° C., 650° C., 700° C., 750 and 800° C. under the identical conditions as mentioned above to observe the rate of degradation of absorber coating. The absorptance and emittance values of the absorber coating are summarized in Table 6. As can be seen from Table 6, the coating retains its optical properties for temperature less than 750° C. Therefore, thermal stability tests were conducted for longer durations at 600° C. under cyclic heating conditions. The optical properties of the absorber coating were measured at regular intervals and are listed in Table 7. As can be seen from Table 7 the absorber coating deposited on SS substrates (without chrome plating) of the present invention retains its minimum solar selectivity ratio 4.43 after subjecting to thermal annealing for long durations (1000 hrs under cyclic heating conditions). Similar results were obtained for the hybrid multilayer solar selective coating of the present invention deposited on chrome plated SS substrates having high solar selectivity ratio in the order of 8-9 after 1000 hrs of heat-treatment at 600° C. in vacuum. This demonstrates that the coating of the present invention can be used for applications in vacuum wherein the temperature is up to 600° C.

TABLE 6

Effect of annealing at different temperatures (in vacuum) on optical properties of the SS/Ti/AlTiN/AlTiON/AlTiO/ormosil solar selective coating of the present invention deposited on SS substrates.

| Temperature (° C.) | Duration (Hrs) | α | ε |
|---|---|---|---|
|  | — | 0.949 | 0.19 |
| 450 | 7 | 0.956 | 0.17 |
| 500 | 3 | 0.956 | 0.17 |
| 550 | 7 | 0.955 | 0.17 |
| 600 | 4 | 0.958 | 0.16 |
| 650 | 6 | 0.963 | 0.18 |
| 700 | 11 | 0.966 | 0.17 |

TABLE 6-continued

Effect of annealing at different temperatures (in vacuum) on optical properties of the SS/Ti/AlTiN/AlTiON/AlTiO/ormosil solar selective coating of the present invention deposited on SS substrates.

| Temperature (° C.) | Duration (Hrs) | α | ε |
|---|---|---|---|
| 750 | 5 | 0.961 | 0.19 |
| 800 | 5 | 0.943 | 0.20 |

TABLE 7

Effect of annealing at 600° C. (in vacuum) on optical properties of the SS/Ti/AlTiN/AlTiON/AlTiO/ormosil solar selective coating of the present invention deposited on SS substrate under cyclic heating conditions.

| Total time of exposure (hrs) | α | ε |
|---|---|---|
| 21 | 0.969 | 0.17 |
| 224 | 0.969 | 0.19 |
| 256 | 0.972 | 0.19 |
| 332 | 0.971 | 0.19 |
| 374 | 0.970 | 0.19 |
| 457 | 0.970 | 0.19 |
| 535 | 0.971 | 0.19 |
| 614 | 0.969 | 0.19 |
| 720 | 0.968 | 0.19 |
| 813 | 0.968 | 0.20-0.21 |
| 928 | 0.939 | 0.21 |
| 1000 | 0.931 | 0.21 |

Example 5

Effect of UV Exposure

The hybrid multilayer solar selective coating of the present invention deposited on SS substrates (without chrome plating) was also subjected to UV irradiation. The UV irradiation tests were carried out using a 50 W Hg lamp at an intensity of 10 mW/cm$^2$. The exposure has been done for 140 hrs (in steps of 30 min) under ambient conditions. No degradation in the absorptance and emittance was observed after UV exposure. The absorptance and emittance values after UV exposure are listed in Table 8. Similar results were obtained for the hybrid multilayer solar selective coating of the present invention deposited on chrome plated SS substrates with improved solar selectivity ratio in the order of 8-9 after 140 hrs of UV exposure.

TABLE 8

Effect of UV exposure on absorptance and emittance of the SS/Ti/AlTiN/AlTiON/AlTiO/ormosil solar selective coating of the present invention deposited on stainless steel substrate.

| Exposure duration (Hrs) | α | ε |
|---|---|---|
| 0 | 0.955 | 0.18 |
| 65 | 0.960 | 0.18 |
| 140 | 0.961 | 0.18 |

Example 6

Effect of Outdoor Exposure

The hybrid multilayer solar selective coating of the present invention, deposited on SS substrates following the procedure, given in Examples 1 and 2, was also exposed to external environment for the duration of 2000 hrs without cover and 4000 hrs with glass cover. 2 sets of SS/Ti/AlTiN/AlTiON/AlTiO/ormosil coatings were exposed to the ambient with and without covering the sample with a glass lid. The sample without a lid is exposed to humidity and other pollutants. For both the samples, the absorptance and emittance values after ambient exposure are listed in Table 9. No change in the absorptance and emittance was observed after exposure to ambient. After the test, the hybrid multilayer solar selective coating deposited on chrome plated SS substrates showed solar selectivity ratio in the order of 8-9. This indicates the environmental stability of the coating of the present invention.

TABLE 9

Effect of exposure to external environment on absorptance and emittance of the SS/Ti/AlTiN/AlTiON/AlTiO/ormosil solar selective coating of the present invention deposited on stainless steel substrate.

| Exposure duration (Hrs) | α | ε |
|---|---|---|
| 0 | 0.956 | 0.18 |
| 2000 (without cover) | 0.959 | 0.18 |
| 4000 (with glass cover) | 0.960 | 0.18 |

Example 7

Effect of Thermal Shock

In order to study the effect of thermal shock the hybrid multilayer solar selective coating of the present invention deposited on SS substrates (without chrome plating), as described in Examples 1 and 2, was heated in air in a resistive furnace at a temperature of 500° C. Annealing involved increasing the temperature of the sample from 25° C. to the 500° C. at a slow heating rate of 3° C./min and maintaining the temperature of 500° C. for 1 hr. Subsequently, the samples were immediately removed from the furnace and were allowed to cool down to room temperature. The samples were again kept in the furnace as stated above. The absorptance and the emittance values of the SS/Ti/AlTiN/AlTiON/AlTiO/ormosil solar selective coating of the present invention deposited on SS substrates after thermal shock are shown in Table 10. The results showed no changes in the values of absorptance and emittance of the solar selective coating of the present invention under thermal shock. Similar results were obtained for the hybrid multilayer solar selective coating of the present invention deposited on chrome plated SS substrates retaining solar selectivity ratio in the order of 8-9 after thermal shock.

TABLE 10

Absorptance and emittance data of the SS/Ti/AlTiN/AlTiON/AlTiO/ormosil solar selective coating of the present invention deposited on stainless steel substrate after thermal shock.

| No. of cycles | α | ε |
|---|---|---|
| 0 | 0.949 | 0.19 |
| 1 | 0.963 | 0.18 |
| 3 | 0.961 | 0.17 |
| 13 | 0.965 | 0.18 |

ADVANTAGES OF THE PRESENT INVENTION

1. The present invention provides a hybrid multilayer solar selective coating having higher solar selectivity ratio for effectively harnessing solar energy.

2. The methods used in the present invention are environment friendly.
3. The hybrid multilayer solar selective coating of the present invention retains its structural composition and optical properties when annealed at high temperature and is stable up to 500° C. in air and up to 600° C. in vacuum under cyclic heating conditions.
4. The hybrid multilayer solar selective absorber coating of the present invention has high oxidation resistance, stable microstructure, high adherence and graded composition particularly suitable for applications in concentrating collectors like evacuated receiver tubes and Fresnel receiver tubes useful for solar steam generation.

The invention claimed is:

1. A hybrid multilayer solar selective coating comprising a tandem stack of layers containing an interlayer of chromium, a first absorber layer of aluminum-titanium nitride (AlTiN), a second absorber layer of aluminum-titanium oxynitride (AlTiON), an antireflection layer of aluminum-titanium oxide (AlTiO) and a barrier layer of organically modified silica (ormosil), wherein said coating exhibits a thermal resistance up to 500° C. in air and up to 600° C. in vacuum with a solar selectivity ratio in the order of 5 to 9.

2. The hybrid multilayer solar selective coating as claimed in claim 1, wherein said coating is stable under UV irradiation, external environment and thermal shock.

3. The hybrid multilayer solar selective coating as claimed in claim 1, wherein thicknesses of first absorber layer, second absorber layer, antireflection layer and barrier layer are in the range of 30-70 nm, 20-40 nm, 30-55 nm and 50-200 nm, respectively.

4. The hybrid multilayer solar selective coating as claimed in claim 1, wherein thickness of chrome interlayer is in the range of 3-7 μm.

5. The hybrid multilayer solar selective coating as claimed in claim 1, wherein the composition of the first absorber layer is: Al=25-55 at. %, Ti=10-25 at. % and N=30-50 at. %, second absorber layer is: Al=15-30 at. %, Ti=10-15 at. %, N=10-20 at. %, anti-reflection layer is Al=15-30 at. %, Ti=5-15 at. % and O=40-80 at. % organically modified sol-gel silica layer (ormosil) is Si=16-30 at. %, C=3-15 at. %, O=25-59 at. % and H=8-44 at. %.

6. The hybrid multilayer solar selective coating as claimed in claim 1, wherein said coating is useful for solar thermal power generation.

7. A process for the preparation of a hybrid multilayer solar selective coating as claimed in claim 1, comprising the steps of:
   a. metallographically polishing and chemically cleaning of substrate in an ultrasonic agitator in acetone, absolute alcohol and trichloroethylene;
   b. depositing a interlayer either by sputtering or electroplating;
   c. depositing solar absorber layers consisting of aluminum titanium nitride (AlTiN), aluminum titanium oxynitride (AlTiON) and aluminum titanium oxide (AlTiO) using four-cathode reactive pulsed direct current unbalanced magnetron sputtering system;
   d. depositing ormosil layer by dip-coating to obtain hybrid multilayer solar selective coating.

8. The process as claimed in claim 7, wherein said substrate is selected from metallic and non-metallic group.

9. The process as claimed in claim 8, wherein said substrate comprises stainless steel having a chrome interlayer configured for reducing emittance.

10. The process as claimed in claim 7, wherein said ormosil layer is prepared by sol gel method using a sol prepared by two precursor silanes consisting of (a) a silane of formula $SiR'_4$, wherein R' is a hydrolysable alkoxy group and (b) silane of the formula $SiR'_n R''_{(4-n)}$, where R' is a hydrolysable alkoxy group and R" is non-hydrolysable group comprising of any one of the groups such as alkyl, vinyl, alkenyl or aryl group, or alkyl group with a functional group such as epoxy, amino, isocyanate or acrylate group containing at least one such non-hydrolysable group.

11. The process as claimed in claim 10, wherein the silane of formula $SiR'_4$ and the silane of the formula $SiR'_n R''_{(4-n)}$ are present in a molar ratio of 1:10 to 10:1.

12. The process as claimed in claim 10, wherein the silane of formula $SiR'_4$ comprises tetraethoxysilane and the silane of the formula $SiR'_n R''_{(4-n)}$ comprises methyl triethoxysilane.

13. The hybrid multilayer solar selective coating as claimed in claim 1, wherein said coating has an absorptance of 0.950 or more and an emittance of 0.11 or less.

* * * * *